United States Patent [19]

Core et al.

[11] Patent Number: 5,314,572

[45] Date of Patent: May 24, 1994

[54] METHOD FOR FABRICATING MICROSTRUCTURES

[75] Inventors: Theresa A. Core, North Andover, Mass.; Roger T. Howe, Lafayette, Calif.

[73] Assignee: Analog Devices, Inc., Norwood, Mass.

[21] Appl. No.: 872,037

[22] Filed: Apr. 22, 1992

Related U.S. Application Data

[63] Continuation-in-part of Ser. No. 569,080, Aug. 17, 1990, abandoned.

[51] Int. Cl.$^5$ ............ H01L 21/306; B44C 1/22; B29C 37/00; C03C 15/00
[52] U.S. Cl. .................. 156/643; 156/644; 156/651; 156/657; 156/668
[58] Field of Search ........... 156/643, 644, 651, 652, 156/653, 657, 659.1, 662, 668; 73/517 R; 437/228

[56] References Cited

U.S. PATENT DOCUMENTS

| | | | |
|---|---|---|---|
| 4,029,346 | 7/1971 | Fernald, Sr. | 4/213 |
| 4,050,049 | 9/1977 | Youmans | 338/47 |
| 4,071,838 | 1/1978 | Block | 338/47 |
| 4,244,225 | 1/1981 | Greenwood | 73/517 |

(List continued on next page.)

FOREIGN PATENT DOCUMENTS

| | | |
|---|---|---|
| 0369352 | 5/1990 | European Pat. Off. |
| 4019821 | 1/1991 | Fed. Rep. of Germany |
| 92/03740 | 3/1992 | World Int. Prop. O. |

OTHER PUBLICATIONS

*Surface-Micromachining Processes for Electrostatic Microactuator Fabrication*, Lober, T. A. and Howe, R. T., IEEE, Jun. 1988 pp. 59–62.
*The Application of Fine-Grained, Tensile Polysilicon to Mechanically Resonant Transducers*, Guckel, H., Sniegowski, J. J., Christenson, T. R. and Raissi F., Sensors and Actuators, A21-A23 1990, pp. 346–351.
*Sensors and Actuators*, vol. 17, Nos. 3 and 4, ISSN 0250-6874 Mark Van Paemel, pp. 629–637.
*Silicon Micromechanics: Sensors and Actuators On a Chip*, IEEE Spectrum, Jul. 1990, pp. 29–31.
*Improved IC-Compatible Piezoelectric Microphone and CMOS Process/Improved IC-Compatible Piezoelectric Microphone and CMOS Process* E. S. Kim, J. R. Kim and R. S. Muller, IEEE May 1991, pp. 270–273.
*A Bipolar Integrated Silicon Pressure Sensor* M. K. Lee, B. N. Lee and S. M. Jung, IEEE May 1991, pp. 300–303.
*Process Integration for Active Polysilicon Resonant Microstructures* M. W. Putty, et al. Sensors and Actuators, 20(1989) pp. 143–151.
*Carbon Film Oxidation-Undercut Kinetics* J. Electrochem. Soc. Solid-State Science and Technology, Aug. 1988, pp. 2086–2090.
*The Application of Fine-Grained, Tensile Polysilicon to Mechanically Resonant Transducers*, H. Guckel et al. Sensors and Actuators, A21–A23 (1990), pp. 346–351.
*Integrated Silicon Electromechanical Vapor Sensor*, R. T. Howe, U-M-I Dissertation Information Service, 1987.
T. W. Kenny, S. B. Waltman, J. K. Reynolds and W. J. Kaiser, *Micromachined Silicon Tunnel Sensor For Motion Detection*, Appl. Phys. Lett. 58(1), Jan. 7, 1991.
Greenwood, John, "Silicon Based Sensors: Technology Overview", Instrument Science and Technology Group of the Institute of Physics, London, Dec. 8, 1986.
Notification of Transmittal of the International Search Report and International Search Report.

*Primary Examiner*—William A. Powell
*Attorney, Agent, or Firm*—Wolf, Greenfield & Sacks

[57] ABSTRACT

A suspended microstructure fabrication process. Photoresist pedestals are inserted in a sacrificial layer between the suspended microstructure and the substrate and photoresist spacers are inserted in the microstructure layer between non contacting portions of the suspended microstructure so that the photoresist pedestals and spacers support the microstructure bridge during the wet etching and drying process used to remove the sacrificial layer.

7 Claims, 6 Drawing Sheets

U.S. PATENT DOCUMENTS

| | | | |
|---|---|---|---|
| 4,342,227 | 8/1982 | Petersen et al. | 73/510 |
| 4,356,730 | 11/1982 | Cade | 73/517 R |
| 4,378,510 | 3/1983 | Bennett | 310/329 |
| 4,430,895 | 2/1984 | Colton | 73/497 |
| 4,435,737 | 3/1984 | Colton | 361/280 |
| 4,483,194 | 11/1984 | Rudolf | 73/517 |
| 4,488,445 | 12/1984 | Aske | 73/517 |
| 4,522,072 | 6/1985 | Sulouff et al. | 73/765 |
| 4,553,436 | 11/1985 | Hansson | 73/517 |
| 4,600,934 | 7/1986 | Aine et al. | 357/26 |
| 4,641,539 | 2/1987 | Vilimek | 73/862 |
| 4,653,326 | 3/1987 | Danel et al. | 73/517 R |
| 4,656,750 | 4/1987 | Pitt et al. | 33/352 |
| 4,660,418 | 4/1987 | Greenwood et al. | 73/514 |
| 4,663,972 | 5/1987 | Cérard | 73/514 |
| 4,670,092 | 6/1987 | Motamedi | 156/643 |
| 4,674,319 | 6/1987 | Muller et al. | 73/23 |
| 4,679,434 | 7/1987 | Stewart | 73/517 |
| 4,691,568 | 9/1987 | Rendek | 73/517 |
| 4,705,659 | 11/1987 | Bernstein . | |
| 4,736,629 | 4/1988 | Cole | 73/517 |
| 4,750,364 | 6/1988 | Kawamura et al. | 73/510 |
| 4,766,768 | 8/1988 | Norling | 73/497 |
| 4,772,928 | 9/1988 | Dietrich et al. | 357/26 |
| 4,776,924 | 10/1988 | Delapierre | 156/647 |
| 4,779,463 | 10/1988 | Woodruff | 73/517 |
| 4,783,237 | 11/1988 | Aine et al. | 156/647 |
| 4,804,875 | 2/1989 | Albert | 310/323 |
| 4,809,552 | 3/1989 | Johnson | 73/517 R |
| 4,829,822 | 5/1989 | Imai et al. | 73/516 R |
| 4,836,025 | 6/1989 | Mihara | 73/517 |
| 4,848,157 | 7/1989 | Kobayashi | 73/517 |
| 4,851,080 | 7/1989 | Howe et al. | 165/647 |
| 4,869,107 | 9/1989 | Murakami | 73/517 |
| 4,874,499 | 10/1989 | Smith et al. | 204/403 |
| 4,879,914 | 11/1989 | Norling | 73/862 |
| 4,882,993 | 11/1989 | Petersen et al. | 73/517 |
| 4,884,446 | 12/1989 | Ljung | 73/505 |
| 4,891,255 | 1/1990 | Ciarlo | 428/131 |
| 4,891,984 | 1/1990 | Fujii et al. | 73/517 |
| 4,891,985 | 1/1990 | Glenn | 73/517 R |
| 4,893,509 | 1/1990 | MacIver et al. | 73/517 |
| 4,896,098 | 1/1990 | Haritonidis et al. | 324/663 |
| 4,901,570 | 2/1990 | Chang et al. | 73/517 |
| 4,901,586 | 2/1990 | Blake et al. | 73/862 |
| 4,908,509 | 3/1990 | Senturia | 356/373 |
| 4,912,990 | 4/1990 | Norling | 73/862 |
| 4,920,800 | 5/1990 | Boura | 73/517 R |
| 4,920,801 | 5/1990 | Church | 73/517 |
| 4,922,756 | 8/1990 | Henrion | 73/517 R |
| 4,926,689 | 5/1990 | Hanson | 73/497 |
| 4,926,696 | 5/1990 | Haritonidis et al. | 73/205 |
| 4,928,203 | 5/1990 | Swindal et al. | 361/280 |
| 4,930,042 | 1/1978 | Wiegand et al. | 361/280 |
| 4,930,043 | 5/1990 | Wiegand | 361/283 |
| 4,930,351 | 6/1990 | Macy et al. | 73/505 |
| 4,934,750 | 7/1990 | Howe et al. | 310/309 |
| 4,939,935 | 7/1990 | Amand | 73/517 |
| 4,942,767 | 7/1990 | Hartionidis et al. | 73/705 |
| 4,943,750 | 7/1990 | Howe et al. | 310/309 |
| 4,945,733 | 8/1990 | LaBrecque | 62/278 |
| 4,945,765 | 8/1990 | Roszhart | 73/517 |
| 4,951,510 | 8/1990 | Holm-Kennedy et al. | 73/862 |
| 4,967,598 | 11/1990 | Wakatsuki et al. | 73/517 R |
| 4,967,605 | 11/1990 | Okada | 73/862 |
| 4,969,359 | 11/1990 | Mikkor | 73/517 |
| 4,980,598 | 12/1990 | Albert | 310/321 |
| 4,987,781 | 1/1991 | Reimann | 73/517 |
| 4,995,233 | 2/1991 | Lulloff | 60/324 |
| 4,997,521 | 3/1991 | Howe et al. | 156/651 |
| 5,000,817 | 3/1991 | Aine | 156/633 |
| 5,005,413 | 4/1991 | Novack et al. | 73/517 |
| 5,006,487 | 4/1991 | Stokes | 437/228 |
| 5,008,774 | 4/1991 | Bullis et al. | 361/283 |
| 5,013,693 | 5/1991 | Guckel et al. | 437/248 |
| 5,016,072 | 5/1991 | Greiff | 357/26 |
| 5,025,346 | 6/1991 | Tang et al. | 361/283 |
| 5,060,039 | 10/1991 | Weinberg et al. | 357/26 |
| 5,060,526 | 10/1991 | Barth et al. | 73/862 |

METHOD FOR FABRICATING MICROSTRUCTURES

RELATED APPLICATION INFORMATION

This application is a continuation-in-part of U.S. patent application Ser. No. 07/569,080 entitled MONOLITHIC ACCELEROMETER, filed on Aug. 17, 1990, now abandoned, and assigned to the same assignee as the present application.

FIELD OF THE INVENTION

The invention pertains to a method for fabricating integrated circuits having suspended microstructures. More particularly, the invention pertains to a method and structure for preventing parts of the microstructure from sticking to the substrate or other parts of the microstructure during fabrication.

BACKGROUND OF THE INVENTION

U.S. patent application Ser. No. 07/569,080 filed on Aug. 17, 1990, abandoned, and entitled Monolithic Accelerometer discloses an integrated circuit comprising a suspended microstructure acceleration sensor and conditioning and resolving circuitry on the same chip. The device disclosed therein can be fabricated by the process generally outlined therein but is more preferably fabricated using the improved process disclosed herein. The disclosure of that application is incorporated herein by reference. The sensor portion of the accelerometer disclosed in that application comprises a polysilicon bridge suspended above a substrate by a series of posts. The polysilicon bridge comprises a suspended longitudinal beam having a plurality of fingers extending transversely therefrom. For each finger extending from the beam, there is a corresponding stationary finger positioned parallel and close thereto. The bridge is electrically conductive and is charged to a different voltage than the stationary fingers. The polysilicon bridge is resilient such that, under accelerative force, the bridge, including the fingers, will move relative to the corresponding stationary fingers. The capacitance between the movable fingers and the stationary fingers is observed and resolved to determine the magnitude of the accelerative force to which the sensor is subjected.

Other suspended microstructures for sensing acceleration and other phenomena are disclosed in U.S. Pat. Nos. 4,711,128; 5,025,346 and 5,054,320.

The fabrication of wafers embodying suspended microstructures is difficult and usually produces a relatively low yield of acceptable chips. A particularly troublesome problem during fabrication is contact and sticking of the microstructure to the substrate. Also, surfaces of the suspended microstructure frequently stick to other surfaces of the suspended microstructure or to other surfaces on the chip during processing. It is extremely difficult to separate the polysilicon microstructure from the substrate, another polysilicon microstructure, or other components of the chip once it has come in contact therewith.

Liquid surface tension effects are among the most significant causes of the microstructure coming in contact with other objects, such as the substrate or other portions of the microstructure. Liquid surface tension effects occur, for instance, during drying after a wet etching step.

In fabricating suspended microstructures, a layer of material (from which the microstructure is to be constructed) is typically deposited over a previously deposited sacrificial layer and then etched into the desired form. The sacrificial layer is then removed by a wet etching process in which the wafer is exposed to a chemical etching solution which dissolves the sacrificial layer but does not affect the material from which the microstructure is formed, e.g., polysilicon. The wafer is then washed in a rinse fluid. As the rinse fluid is removed, the surface tension of the liquid exerts forces on the delicately suspended microstructure, tending to pull the microstructure into contact with the substrate or with other portions of the microstructure or other components of the circuit. A combination of various forces, including adhesive forces and electrostatic forces, makes it extremely difficult to separate the contacting portions. Electrostatic forces may also contribute to the initial attraction of the microstructure to the other surfaces, leading to contact. Accordingly, when undesirable contact occurs, typically the chip is irreparable and must be discarded.

The sacrificial layer must be able to withstand high temperatures on the order of 1000° C. and higher) in order to withstand the temperatures involved in the deposition of the structural layer and subsequent integrated circuit processing steps in conventional fabrication techniques. Accordingly, the sacrificial layer typically must be composed of a material, such as a low temperature, chemical vapor deposited oxide, which can only be practically removed by a wet etching processing. A sacrificial layer of photoresist material, for instance, could not withstand the temperatures involved in polysilicon deposition, i.e., about 600° C. Further, dry etching to remove the sacrificial layer would eliminate the surface tension problem but is typically not possible because a dry etch process would likely damage the suspended microstructure material, e.g., polysilicon, due to the low selectivity of such etching techniques.

Several researchers have reported on this problem and proposed methods to eliminate the effects of liquid surface tension. For instance, H. Guckel, J. J. Sniegowski, T. R. Christenson and F. Raissi, "The Application of Fine Grained, Tensile Polysilicon to Mechanically Resonant Transducers", *Sensors and Actuators*, A21, 1990, pp. 346-351, suggest a method in which the wet etchant final rinse fluid is frozen and sublimated to avoid the deleterious effects of liquid surface tension on microstructures. The disclosed method requires the transfer of wet wafers into a refrigeration unit to freeze the fluid (a water/methanol mixture). The wafer is then placed in a vacuum system to sublimate the frozen fluid. The technique requires special chemicals and the direct transfer of wet wafers into refrigeration and vacuum system. Further, sublimation of the frozen fluid requires very long times, on the order of hours. The proposed system is not practical for manufacturing.

Accordingly, it is an object of the present invention to provide a high yield method of fabricating integrated circuits comprising suspended microstructures.

It is a further object of the present invention to provide an improved method for fabricating suspended microstructures on integrated circuit wafers.

SUMMARY OF THE INVENTION

Starting with a substrate such as silicon, a low temperature oxide layer is deposited on its surface as a sacrificial layer. The oxide layer is then patterned so as to selectively remove portions of the oxide layer to create holes down through the oxide layer to the substrate. A second layer, e.g., polysilicon, is then deposited over the substrate and oxide layer. The polysilicon fills in the holes in the oxide layer and additionally provides a blanket planar covering over the oxide layer. The polysilicon is then patterned.

Selective portions of the oxide layer which have become uncovered due to the removal of portions of the polysilicon layer are selectively etched. Most if not all etching processes can remove material a few microns beyond the edge of the mask. Accordingly, where a hole is patterned in an exposed portion of the oxide layer, a few microns of material is removed from underneath the edges of the suspended microstructure even though those parts of the oxide layer are covered by the microstructure. A photoresist layer is then deposited on the wafer, filling in the holes in the oxide layer as well as the voids in the microstructure layer. The photoresist layer is then patterned to remove the photoresist from the centers of the holes in the outside layer as well as from the gaps in the polysilicon microstructure layer. The photoresist layer which has filled in at the edges of the holes in the oxide layer underneath the edges of the polysilicon structure are not removed since they are occluded from the imaging process by the microstructure.

Further, the etch mask may be designed to leave some photoresist bridging the gaps between non contacting portions of the microstructure layer.

The oxide layer is then removed in a wet etching process which does not effect the photoresist or microstructure materials which remain after the wet etching process. The portions of the photoresist material which were formed beneath the edges of the microstructure remain as pedestals vertically supporting the microstructure. The portions, if any, of the photoresist material which were left in the gaps between non contacting portions of the microstructure provide lateral support preventing the adjacent portions from bending and contacting each other.

The remaining photoresist material is then removed by a long oxygen plasma stripping process which does not present any liquid surface tension problems, thus leaving the microstructure suspended over the substrate.

DETAILED DESCRIPTION OF THE INVENTION

Figure 1:
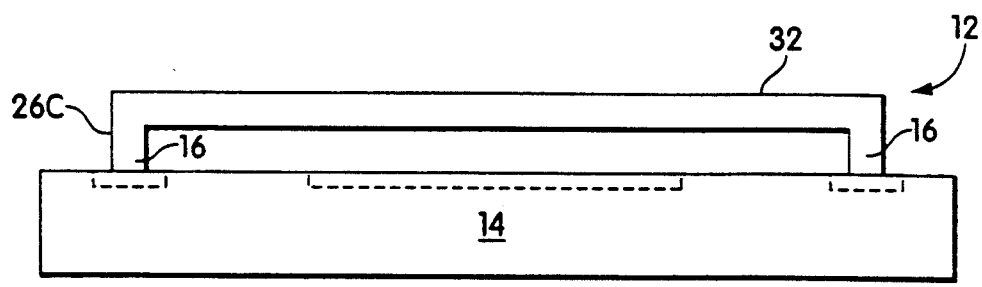
FIG. 1 is a side view of an exemplary suspended bridge microstructure.
Figure 2:
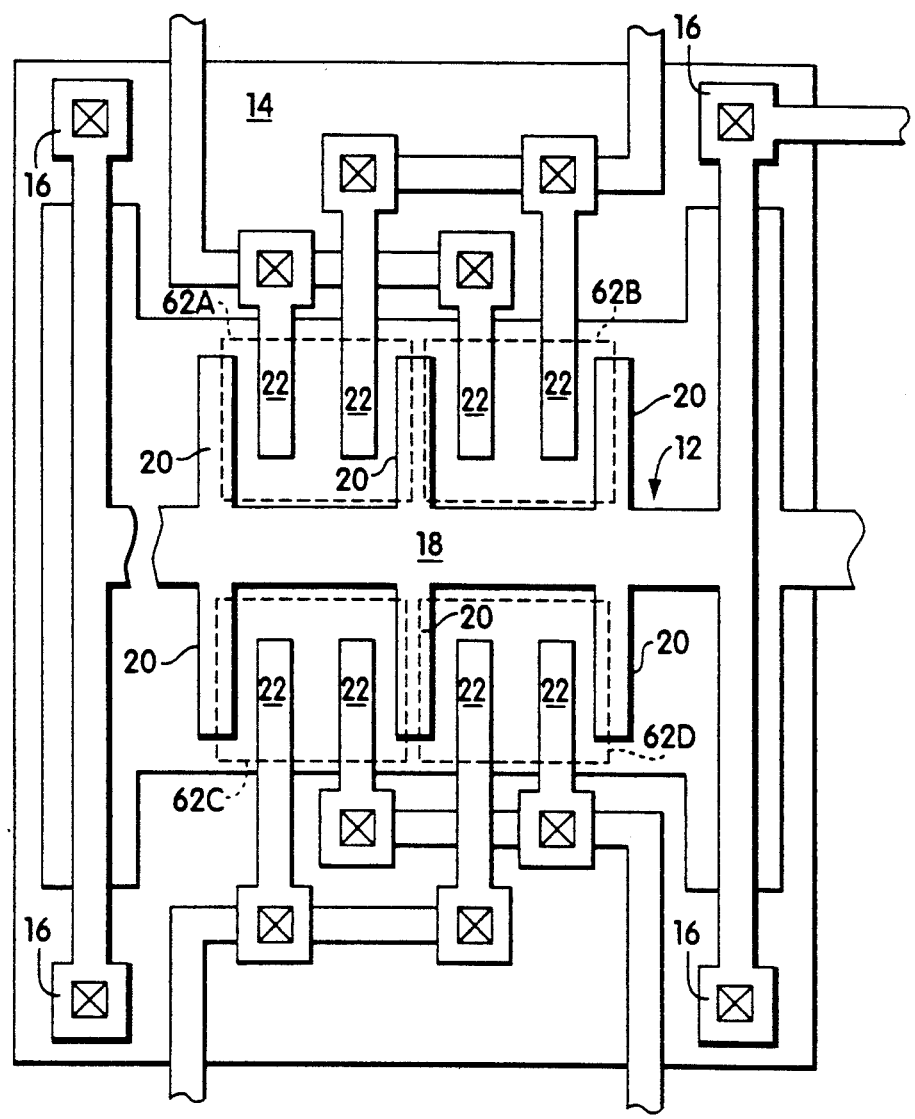
FIG. 2 is a plan view of the exemplary microstructure bridge shown in FIG. 1.

FIGS. 1 and 2 are, respectively, side and plan views of an exemplary suspended microstructure which can be fabricated by the process of the present invention. The microstructure comprises a bridge 12 suspended above a substrate 14 by four corner posts 16. The bridge comprises a central beam 18 having a plurality of fingers 20 extending transversely therefrom. A stationary finger 22 is positioned parallel and adjacent to each finger 20 of the bridge 12. The stationary fingers 22 and the bridge 12 are electrically conductive. The stationary fingers 22 are charged to a different voltage than the bridge such that a capacitive voltage exists between each stationary finger 22 and its corresponding bridge finger 20. When the bridge 12 is subjected to an accelerative force, the bridge 12, and fingers 20, move relative to the stationary fingers 22, thus altering the capacitance between each stationary finger 22 and its corresponding bridge finger 20. Circuitry measures the capacitance, which is directly indicative of the acceleration to which the bridge is subjected.

FIGS. 3–12 are plan and cross-sectional side views showing a particular portion of a microstructure (i.e., three of the bridge fingers 20) during various phases of the fabrication process. The fingers and gaps are not shown to scale. Further, the stationary fingers 22 shown in FIG. 2 are not shown in FIGS. 3–12 in order not to obfuscate the description of the invention. The posts which support the suspended microstructure also are not shown in the drawing in order not to obfuscate the invention. It should also be understood that the chip on which the microstructure is embodied may include other circuitry which may require even further additional steps in the manufacturing process which are not relevant to the present invention. Such steps may affect the suspended microstructure and/or may require even further additional protective steps to be taken in order to prevent such other steps from effecting the microstructure. Typically, the fabrication process of an integrated circuit chip may comprise upwards of 300 steps. Only the handful of steps which are relevant to the present invention are discussed herein.

Figure 3:
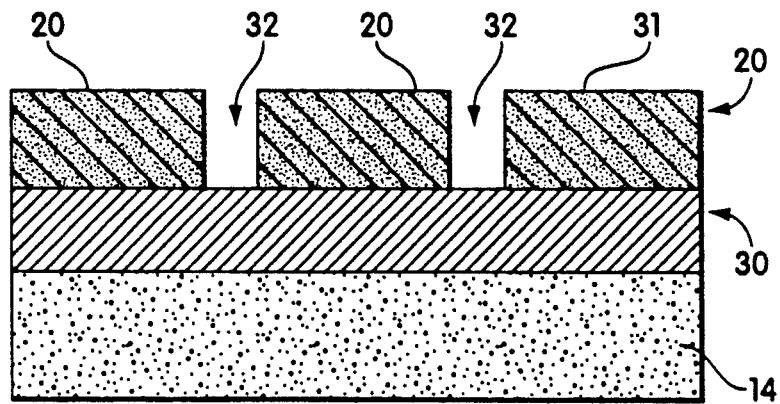
FIG. 3 is a cross sectional side view during a first phase of the fabrication process of the present invention of an exemplary suspended microstructure.
Figure 4:
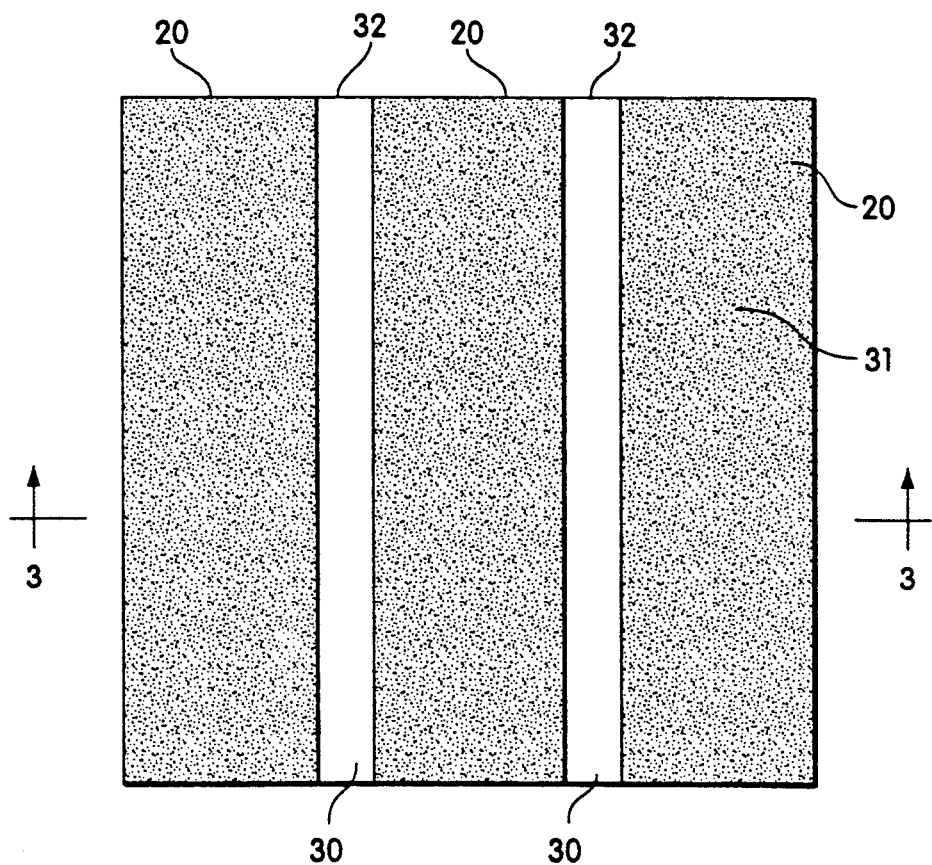
FIG. 4 is a plan view during the first phase of the fabrication process of the present invention of an exemplary suspended microstructure.

FIGS. 3 and 4 are, respectively, a cross sectional side view and a plan view of the microstructure portion of a chip shown at an initial stage of the fabrication process. FIGS. 3 and 4 show the substrate 14 and three fingers 20 of the exemplary sensor. To reach this stage, the substrate 14, which may be constructed of silicon, is covered with a layer of sacrificial spacer material 30 which, for example, may be a low temperature oxide (LTO). Typically, an LTO layer is formed on a substrate by a conventional gas deposition process such as low pressure chemical vapor deposition. However, other conventional methods are known and may be used. The material 31 from which the suspended microstructure is to be fabricated, e.g., polysilicon, is then formed on top of the LTO layer 30. The polysilicon material is then patterned such that the polysilicon material remaining after the patterning process is in the shape of the desired final suspended microstructure. For example, gaps 32 are etched into the layer leaving polysilicon fingers 20.

The polysilicon may be deposited and patterned by any conventional method. For instance, polysilicon may be deposited also by low pressure chemical vapor deposition. The polysilicon may be patterned by a photoresist etching method in which the wafer is coated with a photosensitive polymer, preferably a photoresist, and then patterned by photolithography. The wafer is then exposed to a dry plasma environment (e.g., chlorine and bromine). The plasma vaporizes the portion of the polysilicon which is exposed, while the portion which is protected by the photoresist remains.

Figure 5:
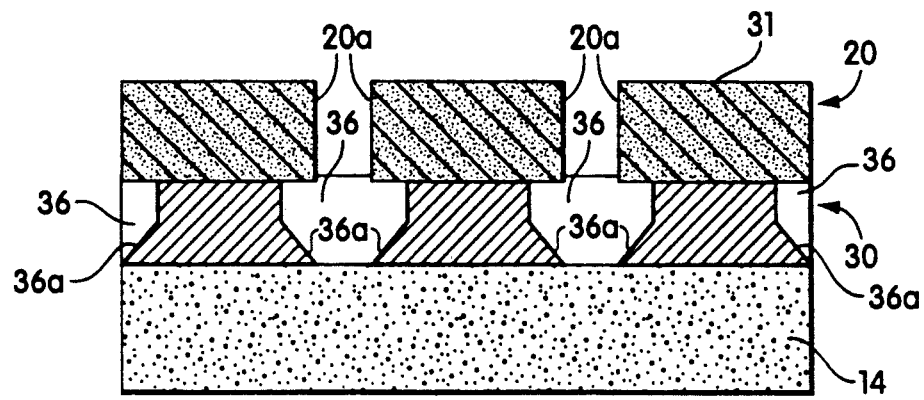
FIG. 5 is a cross sectional side view during a second phase of the fabrication process of the present invention of an exemplary suspended microstructure.
Figure 6:
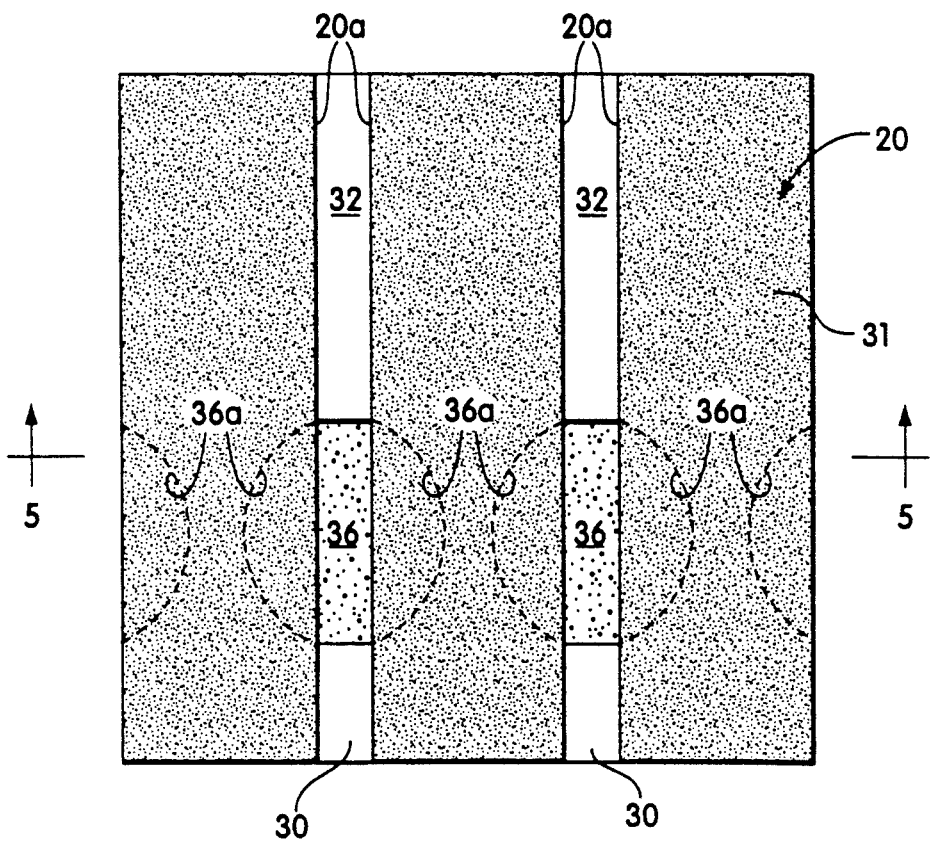
FIG. 6 is a plan view during the second phase of the fabrication process of the present invention of a exemplary suspended microstructure.

FIGS. 5 and 6 show the microstructure portion of FIGS. 3 and 4 at a later stage of the fabrication process. In particular, in FIGS. 5 and 6, the sacrificial spacer layer 30 has been selectively etched to form generally circular holes 36 in the sacrificial layer 30. In this etching step, a blanket of photoresistive material is deposited over the wafer and exposed and developed using a mask which is selected so as strategically to open up areas in the photoresist material where holes 36 in the sacrificial layer are desired. Obviously, these holes must be centered adjacent to the gaps 32 in the microstructure layer 31 since the ultraviolet radiation cannot reach the sacrificial layer where it is covered by polysilicon. A liquid isotropic etchant is then introduced in the strategically opened areas of the photoresist layer The etchant attacks the sacrificial layer and creates holes 36 therein. The liquid etchant does not effect the microstructure material. The duration of the etching process, and the amount and chemical composition of the liquid etchant are selected so that the etchant will absorb into the sacrificial layer material a small amount beyond the opened areas in the photoresist mask. Accordingly, the volume of the sacrificial material which is removed can extend a few microns beyond the portion which is exposed under the photoresist and the microstructure. Thus, as shown in FIGS. 5 and 6, the holes 36 extend slightly beyond the side edges 20a of the fingers 20 and underneath the fingers 20.

Figure 7:
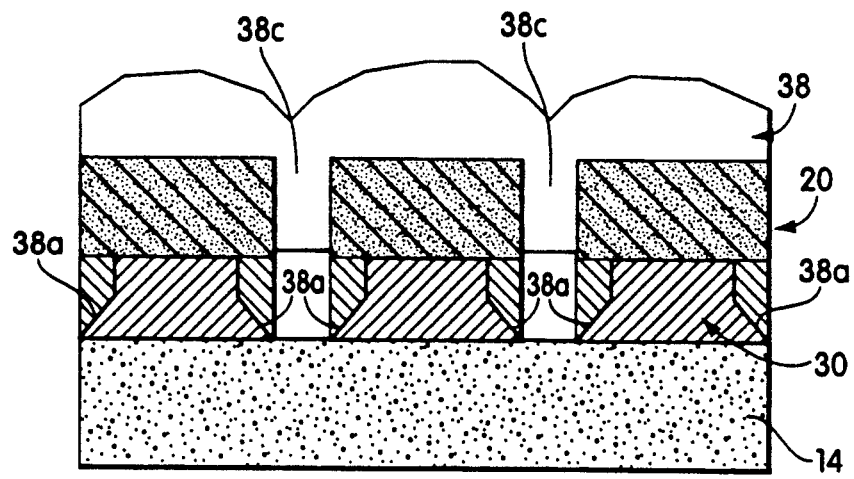
FIG. 7 is a cross sectional side view during a third phase of the fabrication process of the present invention of an exemplary suspended microstructure.
Figure 8:
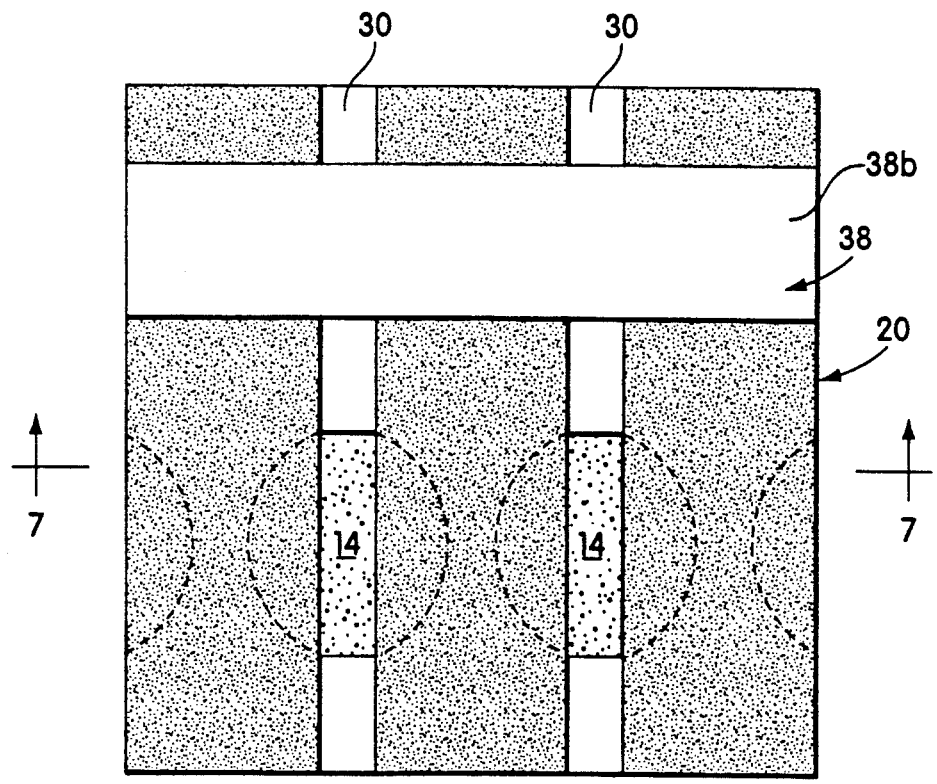
FIG. 8 is a plan view during the third phase of the fabrication process of the present invention of an exemplary suspended microstructure.

FIGS. 7 and 8 show the microstructure portion at a stage subsequent to the stage illustrated in FIGS. 5 and 6. After the stage illustrated in FIGS. 5 and 6, a third layer comprising a photoresist material 38 is deposited over the wafer. A sufficient amount of photoresist material 38 is deposited so as to completely fill all holes 36 in the sacrificial layer and any gaps 32 in the polysilicon layer. The deposition of the photoresist layer is done at a point in the entire fabrication process after all of the high temperature steps have been performed.

The photoresist layer 38 is then patterned in a conventional manner. For instance photoresist etching may be used. The mask for the development of the photoresist material 38 is selected so as to remove the vast majority of photoresist material. The photoresist material in the centers of the holes 36 in the sacrificial layer 30 are completely etched away. However, the portion of the holes 36 which extend beneath the polysilicon fingers are not etched, thus leaving pedestals 38a of photoresist material underneath the edges of the fingers 20. The pedestals extend completely through the sacrificial layer 30 from the top surface of substrate 14 to the bottom surface of fingers 20. In addition, strips of photoresist material such as strip 38b may be left after the photoresist patterning process. Strip 38b forms a blanket over the wafer as illustrated in FIG. 8. Photoresist spacers 38c which are beneath strip 38b also remain in gaps 32 between fingers 20 in the polysilicon layer.

Figure 9:
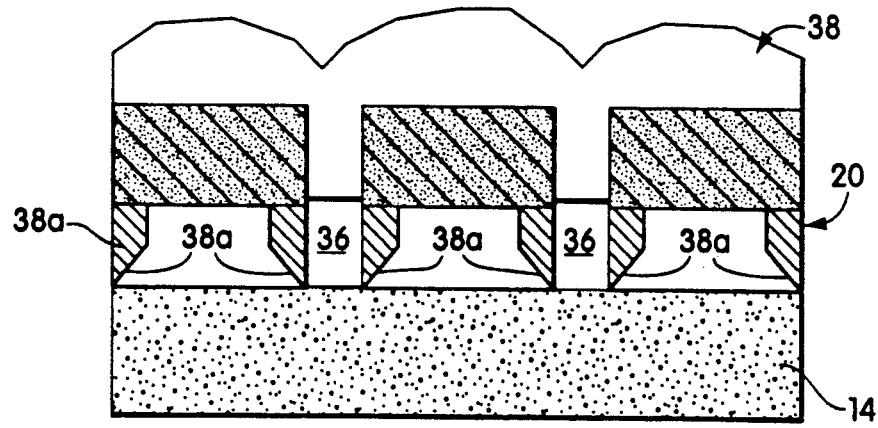
FIG. 9 is a cross sectional side view during a fourth phase of the fabrication process of the present invention of an exemplary suspended microstructure.
Figure 10:
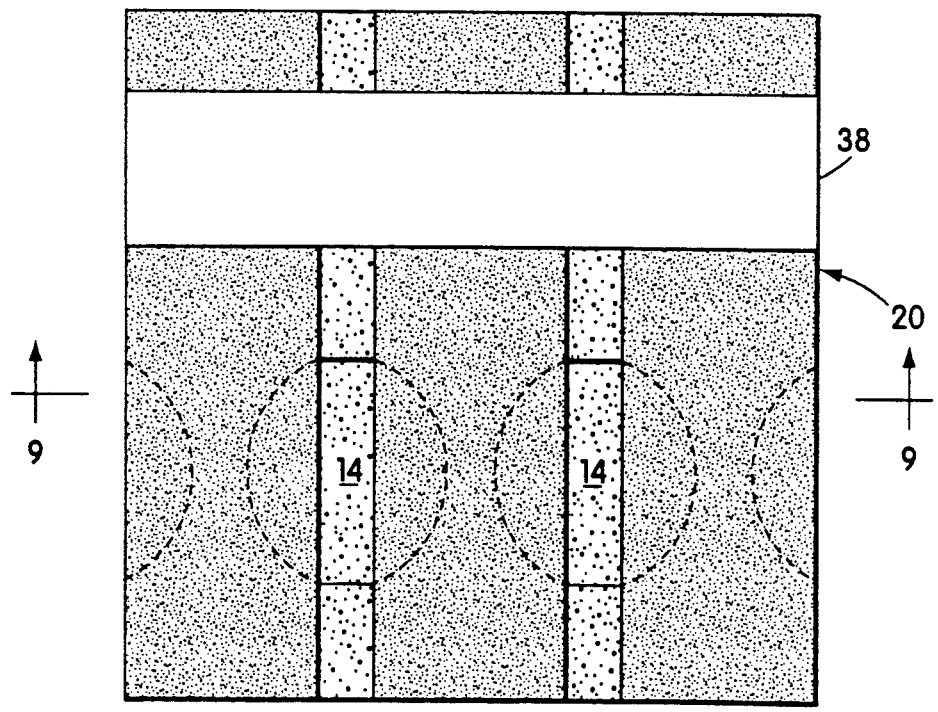
FIG. 10 is a plan view during the fourth phase of the fabrication process of the present invention of an exemplary suspended microstructure.

FIGS. 9 and 10 show the chip after a wet etching step in which the sacrificial layer 30 is removed. In a wet etching process, the wafer is submersed in a chemical bath. The composition of the chemical bath is selected so as to dissolve the low temperature oxide (or other material from which the sacrificial layer is constructed) but not to effect the photoresistive layer 38 or the polysilicon layer. In order to remove all of the sacrificial layer, the wet etching process is commonly quite long in duration. After the chemical bath, the wafer is rinsed in a wash fluid in order to cleanse the wafer of any remaining chemicals from the bath. The wafer is then dried. During the drying process, the surface tension of the rinse liquid exerts a force on the suspended microstructure forcing it towards other nearby surfaces such as the substrate, adjacent stationary fingers or even other parts of the microstructure. However, since photoresist pedestals 38b and spacers 38c remain during and after the chemical wet etching step, the suspended polysilicon portions such as fingers 20 are held stationary and are prevented from coming into contact with other surfaces by photoresist pedestals 38a and spacers 38c.

Figure 11:
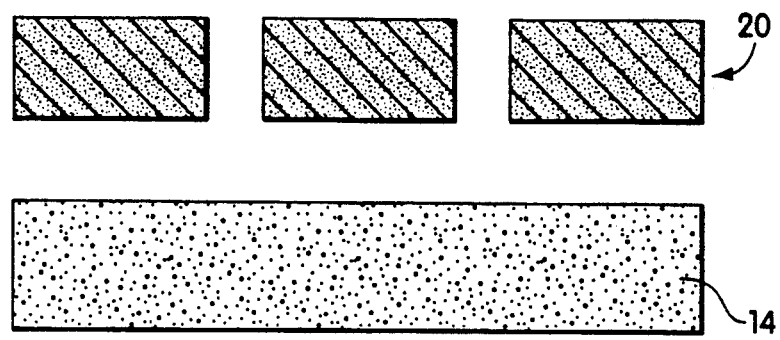
FIG. 11 is a cross-sectional side view during a fifth phase of the fabrication process of the present invention of an exemplary suspended microstructure.
Figure 12:
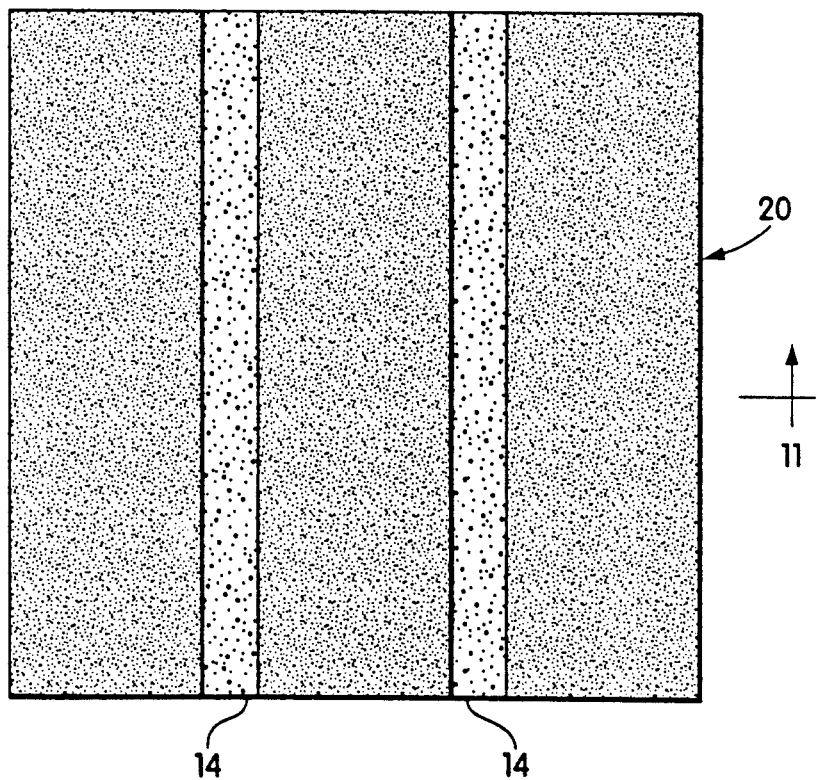
FIG. 12 is a plan view during the fifth phase of the fabrication process of the present invention of an exemplary suspended microstructure.

At this point, the wafer has undergone most of the steps which are potentially harmful to the microstructure. Accordingly, at this point, the remaining photoresistive material 38 can be removed and the suspended microstructure will be in its final suspended form as illustrated in FIGS. 11 and 12. The photoresistive material 38 can be removed by a dry oxygen plasma process which does not present any surface tension problems and does not attack any component of the wafer. An oxygen plasma process will not effect the polysilicon, but will attack and dissolve organics such as the photoresist. Accordingly, since the suspended microstructure has gone through the potentially harmful steps while being supported by the sacrificial layer and/or the photoresistive pedestals and spacers and since the dry oxygen plasma step is not likely to harm the suspended microstructure, the yield of undamaged microstructures from the fabrication process is significantly increased.

Having thus described a few particular embodiments of the invention, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A method of fabricating a suspended microstructure comprising the steps of;
depositing a layer of sacrificial material on a substrate, selectively removing portions of said sacrificial material so as to create holes in said sacrificial layer for formation of posts for said microstructure, depositing a second material over said substrate and said sacrificial layer, said microstructure to be formed of said second material, said second material filling in said holes in said sacrificial layer and forming a second layer over said sacrificial layer, selectively removing portions of said second layer to form gaps in said second layer and to pattern said second layer into a shape comprising said suspended microstructure, whereby portions of said sacrificial layer are exposed beneath said second layer, selectively removing sections of said exposed portions of said sacrificial layer as well as sections of said sacrificial layer adjacent to said exposed portions which are beneath said microstructure so as to form gaps in said sacrificial layer, depositing a photosensitive polymer over said substrate, sacrificial layer and second layer, said photoresistive material filling in said gaps in said sacrificial layer and said second layer, selectively removing portions of said photosensitive polymer from said gaps in said sacrificial layer and said second layer such that some of said photosensitive polymer remains beneath said microstructure forming pedestals between said substrate and said second layer, removing any remaining portions of said sacrificial layer, and removing any remaining portions of said photosensitive polymer.

2. A method as set forth in claim 1 wherein said sacrificial layer comprises an oxide film and said step of removing any remaining portion of said sacrificial layer comprises wet etching.

3. A method as set forth in claim 2 wherein said second material comprises a polysilicon film.

4. A method as set forth in claim 3 wherein said step of removing any remaining portions of said photosensitive polymer comprises exposing said material to an oxygen plasma.

5. A method as set forth in claim 4 wherein said step of selectively removing portions of said sacrificial layer comprises etching said sacrificial material.

6. A method as set forth in claim 5 wherein said step of selectively removing portions of said second layer comprises etching said second material.

7. A method as set forth in claim 1 wherein said step of selectively removing said photoresistive material is performed such that said photoresistive material remaining after said selective removal forms spacers between adjacent portions of said microstructure.

* * * * *